(12) United States Patent
Nguyen et al.

(10) Patent No.: US 8,832,520 B2
(45) Date of Patent: Sep. 9, 2014

(54) HIGH ORDER MODULATION PROTOGRAPH CODES

(75) Inventors: Thuy V. Nguyen, Dallas, TX (US); Aria Nosratinia, Plano, TX (US); Dariush Divsalar, Pacific Palisades, CA (US)

(73) Assignees: California Institute of Technology, Pasadena, CA (US); Board of Regents, The University of Texas System, Austin, TX (US)

( * ) Notice: Subject to any disclaimer, the term of this patent is extended or adjusted under 35 U.S.C. 154(b) by 124 days.

(21) Appl. No.: 13/306,316

(22) Filed: Nov. 29, 2011

(65) Prior Publication Data
US 2013/0139024 A1    May 30, 2013

(51) Int. Cl.
*H03M 13/00* (2006.01)
*H03M 13/05* (2006.01)
*G06F 11/10* (2006.01)
*H03M 13/11* (2006.01)
*H04L 1/00* (2006.01)

(52) U.S. Cl.
CPC ............... *H03M 13/05* (2013.01); *G06F 11/10* (2013.01); *H04L 1/0057* (2013.01); *H03M 13/116* (2013.01)
USPC ........................................................ 714/752

(58) Field of Classification Search
None
See application file for complete search history.

(56) References Cited

U.S. PATENT DOCUMENTS

| | | | |
|---|---|---|---|
| 7,095,792 B2 | 8/2006 | Doetsch et al. | |
| 7,343,539 B2 * | 3/2008 | Divsalar et al. | 714/755 |
| 7,499,490 B2 | 3/2009 | Divsalar et al. | |
| 7,553,697 B2 | 6/2009 | Eng et al. | |
| 7,908,541 B2 | 3/2011 | Kyung et al. | |
| 8,117,523 B2 | 2/2012 | Divsalar et al. | |
| 8,132,072 B2 | 3/2012 | El-Khamy et al. | |
| 8,239,746 B2 | 8/2012 | Divsalar et al. | |
| 8,266,493 B1 * | 9/2012 | Abbaszadeh et al. | 714/752 |
| 8,369,448 B2 * | 2/2013 | Zhang et al. | 375/298 |
| 8,495,450 B2 * | 7/2013 | Abu-Surra et al. | 714/752 |
| 8,560,911 B2 | 10/2013 | Abu-Surra et al. | |
| 2006/0291571 A1 | 12/2006 | Divsalar et al. | |
| 2006/0294445 A1 | 12/2006 | Divsalar et al. | |
| 2007/0162815 A1 | 7/2007 | El-Khamy et al. | |
| 2007/0283216 A1 | 12/2007 | Kyung et al. | |
| 2008/0059862 A1 | 3/2008 | Kyung et al. | |
| 2008/0222486 A1 | 9/2008 | Richardson et al. | |
| 2008/0294969 A1 | 11/2008 | Divsalar et al. | |

(Continued)

FOREIGN PATENT DOCUMENTS

JP    2009-044732    2/2009

OTHER PUBLICATIONS

PCT International Search Report mailed on Apr. 18, 2012 for PCT Application No. PCT/US2011/040095 filed on Jun. 10, 2011 in the name of California Institute of Technology et al.

(Continued)

*Primary Examiner* — Daniel McMahon
(74) *Attorney, Agent, or Firm* — Steinfl & Bruno LLP

(57) ABSTRACT

Digital communication coding methods for designing protograph-based bit-interleaved code modulation that is general and applies to any modulation. The general coding framework can support not only multiple rates but also adaptive modulation. The method is a two stage lifting approach. In the first stage, an original protograph is lifted to a slightly larger intermediate protograph. The intermediate protograph is then lifted via a circulant matrix to the expected codeword length to form a protograph-based low-density parity-check code.

18 Claims, 6 Drawing Sheets

(56) References Cited

U.S. PATENT DOCUMENTS

| | | | |
|---|---|---|---|
| 2009/0019333 | A1 | 1/2009 | McEvoy et al. |
| 2010/0023834 | A1 | 1/2010 | Richardson et al. |
| 2010/0169736 | A1 | 7/2010 | Garani |
| 2010/0192047 | A1 | 7/2010 | Murakami et al. |
| 2010/0257425 | A1 | 10/2010 | Yue et al. |
| 2011/0047433 | A1* | 2/2011 | Abu-Surra et al. ............ 714/752 |
| 2011/0066916 | A1* | 3/2011 | Abu-Surra et al. ............ 714/752 |
| 2012/0131409 | A1 | 5/2012 | Divsalar et al. |
| 2012/0309453 | A1* | 12/2012 | Maguire .................... 455/556.1 |

OTHER PUBLICATIONS

PCT Written Opinion mailed on Apr. 18, 2012 for PCT Application No. PCT/US2011/040095 filed on Jun. 10, 2011 in the name of California Institute of Technology et al.

PCT International Search Report mailed Aug. 29, 2012 for PCT/US2011/062382 filed on Nov. 29, 2011 in the name of California Institute of Technology.

PCT Written Opinion mailed Aug. 29, 2012 for PCT/US2011/062382 filed on Nov. 29, 2011 in the name of California Institute of Technology.

X. Hu, E. Eleftheriou, and D.M. Arnold, "Regular and irregular progressive edge-growth tanner graphs," *IEEE Transactions on Information Theory*, vol. 51, issue 1, 2005, pp. 386-398.

T. Tian, C.R. Jones, J.D. Villasenor, and R.D. Wesel, "Selective avoidance of cycles in irregular LDPC code construction," *IEEE Transactions on Communications*, vol. 52, Issue 8, 2004, pp. 1242-1247.

T. Tian, C.R. Jones, J.D. Villasenor, and R.D. Wesel, "Construction of irregular LDPC codes with low error floors," *IEEE International Conference on Communications*, 2003, vol. 5, pp. 3125-3129.

S. Abu-Surra, D. Divsalar and W. Ryan, "On the existence of typical minimum distance for protograph-based LDPC codes," in Information Theory and Applications Workshop (ITA), Jan. 2010, pp. 1-7.

D. Divsalar, S. Dolinar, C. R. Jones, and K. Andrews, "Capacity approaching protograph codes," *IEEE J. Select. Areas Communication*, vol. 27, No. 6, pp. 876-888, Aug. 2009.

G. Liva and M. Chiani, "Protograph LDPC codes design based on EXIT analysis," *Proc. IEEE GLOBECOM*, Nov. 2007, pp. 3250-3254.

T. V. Nguyen, A. Nosratinia, and D. Divsalar, "The design of rate compatible protograph LDPC codes," IEEE Trans. Commun., 2011.

T. J. Richardson, M. A. Shokrollahi, and R. L. Urbanke, "Design of capacity-approaching irregular low-density parity-check codes," IEEE Trans. Inform. Theory, vol. 47, No. 2, pp. 619-637, Feb. 2001.

S. ten Brink, "Convergence behavior of iteratively decoded parallel concatenated codes," IEEE Trans. Commun., vol. 49, No. 10, pp. 1727-1737, Oct. 2001.

D. Divsalar and C. Jones, "Protograph based low error floor LDPC coded modulation," in Proc. IEEE MILCOM, Oct. 2005, pp. 378-385 vol. 1.

Jacobsen, N. and Soni, R., "Design of rate-compatible irregular LDPC codes based on edge growth and parity splitting," in *Proc. IEEE Vehicular Technology Conference (VTC)*, 2007, pp. 1052-1056 (Oct. 2007).

El-Khamy, M., Hou, J. and Bhushan, N., "Design of rate-compatible structured LDPC codes for hybrid ARQ applications," *IEEE J. Select. Areas Commun.*, vol. 27, No. 6, pp. 965-973 (Aug. 2009).

Dolinar, S., "A rate-compatible family of protograph-based LDPC codes built by expurgation and lengthening," Proc. IEEE ISIT, pp. 1-5 (Sep. 2005).

Richardson, T. and Urbanke, R., "Multi-edge type LDPC codes," *Tech. Rep.*, pp. 1-36 (Apr. 2004).

Abbasfar, A., Divsalar, D. and Yao, K., "Accumulate-repeat-accumulate codes," *IEEE Trans. Commun.*, vol. 55, No. 4, pp. 692-702 (Apr. 2007).

Li, J. and Narayanan, K. R., "Rate-compatible low density parity check codes for capacity-approaching ARQ schemes in packet data communications," *Proc. CIIT*, pp. 1-6 (Nov. 2002).

Yazdani, M. R. and Banihashemi, A. H., "On construction of rate compatible low-density parity-check codes," *IEEE Commun. Lett.*, vol. 8, No. 3, pp. 159-161 (Mar. 2004).

Ha, J., Kim, J., and McLaughlin, S., "Rate-compatible puncturing of low density parity-check codes," *IEEE Trans. Inform. Theory*, vol. 50, No. 11, pp. 2824-2836 (Nov. 2004).

Pishro-Nik H. and Fekri, F., "Results on punctured LDPC codes," *Proc. IEEE Information Theory Workshop*, pp. 215-219 (Oct. 2004).

Sendonaris, A., Erkip, E. and Aazhang, B., "User cooperation diversity. Part I: System Description," *IEEE Trans. Commun.*, vol. 51, No. 11, pp. 1927-1938 (Nov. 2003).

Sendonaris, A., Erkip, E. and Aazhang, B., "User cooperation diversity. Part II. Implementation aspects and performance analysis," *IEEE Trans. Commun.*, vol. 51, No. 11, pp. 1939-1948 (Nov. 2003).

Hunter, T. and Nosratinia, A. "Cooperation diversity through coding," *Proc. IEEE ISIT*, p. 220 (Jun. 2002).

Laneman, J., Tse, D. and Wornell, G., "Cooperative diversity in wireless networks: Efficient protocols and outage behavior," *IEEE Trans. Inform. Theory*, vol. 50, No. 12, pp. 3062-3080 (Dec. 2004).

Laneman, J. and Wornell, G., "Distributed space-time-coded protocols for exploiting cooperative diversity in wireless networks," *IEEE Transactions on Information Theory*, vol. 49, No. 10, pp. 2415-2425 (Oct. 2003).

Cover, T. and Gamal, A. E., "Capacity theorems for the relay channel," *IEEE Trans. Inform. Theory*, vol. 25, No. 5, pp. 572-584 (Sep. 1979).

Kramer, G., Gastpar, M. and Gupta, P., "Cooperative strategies and capacity theorems for relay networks," *IEEE Trans. Inform. Theory*, vol. 51, No. 9, pp. 3037-3063 (Sep. 2005).

Razaghi, P. and Yu, W., "Bilayer low-density parity-check codes for decode-and-forward in relay channels," *IEEE Trans. Inform. Theory*, vol. 53, No. 10, pp. 3723-3739 (Oct. 2007).

Xie, L.L. and Kumar, P.R., "An achievable rate for the multiple level relay channel," *IEEE Trans. Information Theory*, vol. 51, No. 4, pp. 1348-1358 (Apr. 2005).

Hsu, CH, et al., Capacity Achieving LDPC Codes Through Puncturing, IEEE Trans. Inform. Theory 2008, 54: 4698-4706.

Thrope, J., et al., Methodologies for Designing LDPC Codes Using Protographs and Circulants, Proc. IEEE ISIT 2004, 236.

Divsalar, D., et al., Low-rate LDPC codes with simple protograph structure, Proc. IEEE ISIT 2005, 1622-1626.

Nyugen T., et al., Bilayer Protograph Codes for Half-Duplex Relay Channels, ISIT 2010, 948-952.

Thrope, J., et al., Low-Density Parity-Check (LDPC) Codes Constructed from Protographs, IPC Progress Report, Aug. 2003, 1-7.

Nguyen, T., et al., The Design of Rate-Compatible Protograph LDPC Codes, 48th Ann. Allerton Conference, Allerton House, UIUC, Illinois, Sep. 29-Oct. 1, 2010, 1-5.

Tian, T., et al., Construction of Rate-Compatible LDPC Codes Utilizing Information Shortening and Parity Puncturing, EURASIP J. on Wireless Comm. and Networking 2005, 5: 789-795.

Nyugen, T. et al., "Threshold of Protograph-based LDPC Coded BICM for Rayleigh Fading," in Proc. *IEEE Global Telecommunications Conference (GLOBECOM)*, Houston, Texas, 2011, 1-5.

Non-Final Office Action mailed on Jul. 1, 2013 for U.S. Appl. No. 13/158,263, filed Jun. 10, 2011 in the name of California Institute of Technology.

Notice of Allowance mailed on Nov. 18, 2013 for U.S. Appl. No. 13/158,263, filed Jun. 10, 2011 in the name of California Institute of Technology.

\* cited by examiner

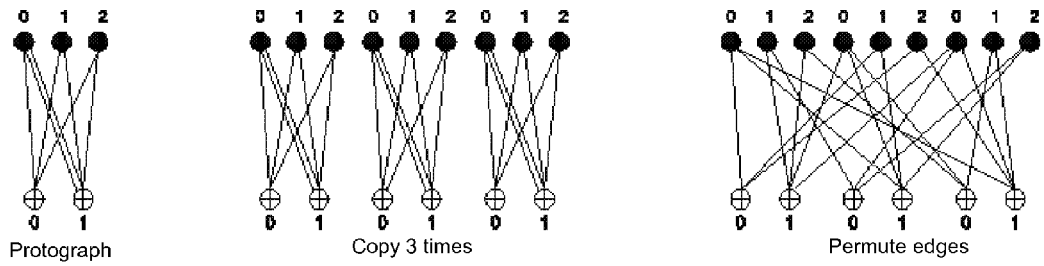
Protograph    Copy 3 times    Permute edges
FIG. 1
(PriorArt)

$$H'_{1/2} = \begin{pmatrix} 1 & 2 & 0 & 0 & 0 & 1 & 0 \\ 0 & 3 & 1 & 1 & 1 & 1 & 0 \\ 0 & 1 & 2 & 2 & 1 & 2 & 1 \\ 0 & 2 & 0 & 0 & 0 & 0 & 2 \end{pmatrix}_{4 \times 7}$$

$$H'_{2/3} = \left( H'_{1/2} \begin{array}{ccc} 0 & 1 & 1 \\ 1 & 0 & 1 \\ 2 & 2 & 2 \\ 0 & 1 & 0 \end{array} \right)_{4 \times 10}$$

$$H'_{3/4} = \left( H'_{2/3} \begin{array}{ccc} 0 & 0 & 1 \\ 1 & 2 & 0 \\ 2 & 1 & 2 \\ 0 & 0 & 2 \end{array} \right)_{4 \times 13}$$

$$H'_{4/5} = \left( H'_{3/4} \begin{array}{ccc} 0 & 1 & 2 \\ 1 & 1 & 2 \\ 2 & 2 & 1 \\ 0 & 0 & 0 \end{array} \right)_{4 \times 16}$$

FIG. 7

MAPPING OF THE RATE-1/2 AR4JA TO 16-QAM UNDER AWGN

| Method | Divsalar & Jones | Disclosed approach | Capacity |
|---|---|---|---|
| Threshold (dB) | 2.853 | 2.812 | 2.286 |

FIG. 10

THRESHOLDS OF AR4JA CODED FAMILY IN RAYLEIGH FADED CHANNELS

| Code Rate | QPSK(dB) | | | 8PSK(dB) | | | 16QAM(dB) | | |
|---|---|---|---|---|---|---|---|---|---|
| | Thd. | cap. | gap | thd. | cap. | gap | thd. | cap. | gap |
| 1/2 | 2.326 | 1.852 | 0.474 | 4.019 | 3.388 | 0.631 | 4.783 | 4.129 | 0.654 |
| 2/3 | 4.242 | 3.660 | 0.582 | 6.118 | 5.598 | 0.520 | 6.992 | 6.219 | 0.773 |
| 3/4 | 5.458 | 4.944 | 0.514 | 7.546 | 6.972 | 0.574 | 8.401 | 7.665 | 0.736 |
| 4/5 | 6.598 | 5.966 | 0.632 | 8.666 | 7.985 | 0.681 | 9.364 | 8.679 | 0.685 |

FIG. 11

THRESHOLDS OF 395 CODED FAMILY IN RAYLEIGH FADED CHANNELS

| Code Rate | QPSK(dB) | | | 8PSK(dB) | | | 16QAM(dB) | | |
|---|---|---|---|---|---|---|---|---|---|
| | Thd. | cap. | gap | thd. | cap. | gap | thd. | cap. | gap |
| 1/2 | 2.158 | 1.852 | 0.306 | 3.722 | 3.388 | 0.334 | 4.556 | 4.129 | 0.427 |
| 2/3 | 3.916 | 3.660 | 0.256 | 5.728 | 5.598 | 0.130 | 6.508 | 6.219 | 0.289 |
| 3/4 | 5.146 | 4.944 | 0.202 | 7.100 | 6.972 | 0.128 | 7.879 | 7.665 | 0.214 |
| 4/5 | 6.102 | 5.966 | 0.136 | 8.154 | 7.985 | 0.169 | 8.882 | 8.679 | 0.203 |

FIG. 12

THRESHOLDS ($E_b/N_0$) OF RATE-COMPATIBLE CODES IN RAYLEIGH FADED CHANNELS

| Code Rate | QPSK(dB) | | | 8PSK(dB) | | | 16QAM(dB) | | |
|---|---|---|---|---|---|---|---|---|---|
| | Thd. | cap. | gap | thd. | cap. | gap | thd. | cap. | gap |
| 3/4 | 5.146 | 4.944 | 0.202 | 7.100 | 6.972 | 0.128 | 7.879 | 7.665 | 0.214 |
| 0.6 | 2.959 | 2.850 | 0.109 | 4.779 | 4.652 | 0.127 | 5.561 | 5.290 | 0.271 |
| 1/2 | 2.009 | 1.852 | 0.157 | 3.558 | 3.388 | 0.170 | 4.289 | 4.129 | 0.160 |
| 0.45 | 1.487 | 1.399 | 0.088 | 3.008 | 2.893 | 0.115 | 3.704 | 3.567 | 0.137 |

FIG. 13

HIGH ORDER MODULATION PROTOGRAPH CODES

STATEMENT REGARDING FEDERALLY SPONSORED RESEARCH OR DEVELOPMENT

The invention described herein was made in the performance of work under a NASA contract, and is subject to the provisions of Public Law 96-517 (35 USC 202) in which the Contractor has elected to retain title.

BACKGROUND

1. Field

The present disclosure relates to constructing low-density parity-check (LDPC) codes from small template graphs called protographs. More in particular, it relates to methods for designing protographs that accommodate modulation levels above simple binary coding.

2. Description of Related Art

DEFINITIONS

As known to the person skilled in the art and as also mentioned in U.S. Pat. No. 7,343,539 incorporated herein by reference in its entirety, a low-density parity-check (LDPC) code is a linear code determined by a sparse parity-check matrix H having a small number of 1 s per column. The code's parity-check matrix H can be represented by a bipartite Tanner graph wherein each column of H is represented by a transmitted variable node, each row by a check node, and each "1" in H by a graph edge connecting the variable node and check node that correspond to the column-row location of the "1". The code's Tanner graph may additionally have non-transmitted variable nodes. Each check or constraint node defines a parity check operation. Moreover, the fraction of a transmission that bears information is called the rate of the code. An LDPC code can be encoded by deriving an appropriate generator matrix G from its parity-check matrix H. An LDPC code can be decoded efficiently using a well-known iterative algorithm that passes messages along edges of the code's Tanner graph from variable nodes to check nodes and vice-versa until convergence is obtained, or a certain number of iterations is reached.

A protograph is a Tanner graph with a relatively small number of nodes, connected by a small number of edges, allowing multiple parallel edges between two nodes. Each edge is a type. Thus, the number of total edges represents the number of types that exists in the protograph. A protograph code (an equivalent LDPC code) is a larger derived graph constructed by applying a "copy-and-permutation" operation on a protograph. The protograph is copied N times, then a large LDPC code graph is obtained by permuting N variable-to-check pairs (edges), corresponding to the same edge type of the original protograph. The resulting protograph code has N times as many nodes as the protograph, but it has the same rate and the same distribution of variable and check node degrees. Thus, the degree distribution of a protograph-based LDPC code is the same as that of the protograph. A simple example of a protograph is shown in FIG. 1. This graph consists of 3 variable nodes and 2 check nodes that are interconnected by 7 different edge (variable-to-check) types. The derived graph is constructed by replicating the protograph 3 times, and permuting variable-to-check pairings within the same edge type of the protograph. A protograph can also be represented by a proto-matrix. For example, the proto-matrix of the protograph shown in the left portion of FIG. 1 has the form shown in Eq. 1 below:

$$H_{proto} = \begin{pmatrix} 1 & 1 & 1 \\ 2 & 1 & 1 \end{pmatrix} \qquad \text{Eq. 1}$$

where the rows and columns represent the check nodes and variable nodes in the graph respectively. The elements in the matrix are the number of parallel edges that connect the variable node and the check node associated with their positions.

One way to construct larger codes is to replace each integer j in the proto-matrix with sum of j different N×N permutation matrices. If the integer is 1, it would be replaced with 1 N×N permutation matrix. Another way is to first expand the protograph by a small factor such that the H matrix for the resulting expanded protograph does not contain any integer larger than 1. Then each integer 1 in the H matrix will be replaced with an N×N permutation matrix. The assigned N×N permutations can be any type of permutations, including circulant permutations. An N×N identity matrix can be regarded as a trivial permutation matrix. If the N×N permutation is a circulant permutation, then define matrix X as one circular shift of the identity matrix to the left. Using this notation, then all circulant permutations can be represented by $X^i$, for $i=0, 1, \ldots, (N-1)$. The selection and assignment of permutation matrices to construct N times larger LDPC code can be based on enlarging the smallest loop size in the expanded graph. Other optimization methods include Progressive Edge Growth (PEG) for circulant matrices (see, for example X. Hu, E. Eleftheriou, and D. M. Arnold, "Regular and irregular progressive edge-growth tanner graphs," *IEEE Transactions on Information Theory*, Vol. 51, issue 1, 2005, pp. 386-398, hereinafter X. Hu, et al.), or the Approximate Cycle Extrinsic message degree (ACE) algorithm (see, for example, T. Tian, C. R. Jones, J. D. Villasenor, and R. D. Wesel, "Selective avoidance of cycles in irregular LDPC code construction," *IEEE Transactions on Communications*, Volume 52, Issue 8, 2004, pp. 1242-1247, or T. Tian, C. R. Jones, J. D. Villasenor, and R. D. Wesel, "Construction of irregular LDPC codes with low error floors," *IEEE International Conference on Communications,* 2003, Vol. 5, pp. 3125-3129). So, in the case of circulant permutations, these optimization algorithms can be applied to obtain powers of X in the H matrix of the expanded protograph.

The rate of a protograph is defined to be the lowest (and typical) rate of any LDPC code constructed from that protograph. All LDPC codes constructed from a given protograph have the same rate except for possible check constraint degeneracies, which can increase (but never decrease) this rate and typically occur only for very small codes. Since the protograph serves as a blueprint for the Tanner graph representing any LDPC code expandable from that protograph, it also serves as a blueprint for the routing of messages in the iterative algorithm used to decode such expanded codes through a permutation per each edge type. The rate of a protograph code is computed as shown below in Eq. 2:

$$r = \frac{n-m}{n-n_0} \qquad \text{Eq. 2}$$

where n and m are number of variable nodes and check nodes respectively in the protograph, $n_0$ is number of punctured (untransmitted) variable nodes.

Excluding check nodes connected to degree-1 variable nodes, applicants have proved that the number of degree-2 nodes should be at most one less than the number of check nodes provided that no loop exists in the graph between degree-2 nodes and the checks connected to these nodes for a protograph to have the linear minimum distance property. A given protograph is said to have the linear minimum distance property if the typical minimum distance of a random ensemble of arbitrarily large LDPC codes built from that protograph grows linearly with the size of the code, with linearity coefficient which can be denoted by $\delta_{min}>0$ (see S. Abu-Surra, D. Divsalar and W. Ryan, "On the existence of typical minimum distance for protograph-based LDPC codes," in Information Theory and Applications Workshop (ITA), January 2010, pp. 1-7).

The iterative decoding threshold of a given protograph is similarly defined with respect to this random ensemble of LDPC codes as the lowest value of signal-to-noise ratio for which an LDPC decoder's iterative decoding algorithm will find the correct codeword with probability approaching one as the size of an LDPC code built from that protograph is made arbitrarily large. Iterative decoding thresholds can be calculated by using a reciprocal channel approximation (D. Divsalar, S. Dolinar, C. R. Jones, and K. Andrews, "Capacity approaching protograph codes," *IEEE J. Select. Areas Communication*, vol. 27, no. 6, pp. 876-888, August 2009, hereinafter D. Divsalar, et al.) or the PEXIT method (see, for example, G. Liva and M. Chiani, "Protograph LDPC codes design based on EXIT analysis," in *Proc. IEEE GLOBECOM*, November 2007, pp. 3250-3254, hereinafter G. Liva, et al.). Thresholds can be lowered either by using precoding (a subgraph of the protograph with degree-1 nodes, check nodes connected to these degree-1 nodes, and all edges connected to these checks and other variable nodes with at least one punctured node) or through the use of at least one very high-degree node in the base protograph. A protograph is said to have a low iterative decoding threshold if its threshold is close to the capacity limit for its rate.

A family of protographs of different rates is said to be rate-compatible with embedding or embedded rate-compatible if the protographs for different rates produce embedded codewords with the same information block-length. In other words, with the same input, the codeword of a high-rate code is embedded into the codeword of a lower-rate code. This property makes this family of protographs suitable for Hybrid Automatic Repeat Request (HARQ) applications.

Coded modulation is a method of communication where the messages are encoded with an error correcting code, and the resulting coded bits are mapped to modulation symbols such as BPSK, M-PSK, or M-QAM modulations. The overall efficiency of the coded modulation is measured by spectral efficiency, whose unit is bits/seconds/Hz.

Bit-interleaved coded modulation (BICM) is a technique that allows relatively simple design of bandwidth-efficient coded modulation systems. A general BICM system is shown in FIG. 2. The information sequence is encoded by an LDPC encoder to get a coded bit sequence. Depending on the fading regime, the coded sequence may be bit-interleaved before being sent to a modulator. The M-ary modulator maps $m=\log_2 M$ coded bits at a time to a complex symbol chosen from an M-ary constellation $\chi$. The discrete-time baseband channel model can be written as shown in Eq. 3 below:

$$y_t = hx_t + w_t \quad \text{Eq. 3}$$

where t is the discrete time index, $y_t$ is the received signal, $x_t$ is the transmitted symbol, $h=h_I+ih_Q$ is the zero mean complex Gaussian distributed fading coefficient with the variance of ½ in each dimension and $w_t$ is a complex white Gaussian noise sample with the zero mean and the variance per dimension of $\sigma^2=N_0/2$. It is assumed that the channel state information is available at the receiver, i.e. the receiver can estimate the channel coefficient h.

The MAP symbol-to-bit metric calculator will compute the symbol-to-bit metrics based on the received symbol y from the channel. These bit metrics are passed to a decoder, which employs the iterative belief propagation algorithm. When an interleaver is used in the transmitter, the bit metrics in the receiver are de-interleaved before being passed to the LDPC decoder. Let $\chi_b^i$ be the subset of all the signal points $x \in \chi$ hole label has value $b \in \{0, 1\}$ in position i. The symbol-to-bit metric is computed by the MAP calculator at each time to feed into the iterative decoder is given as shown below in Eq. 4:

$$L_i = L(b_i \mid y) \quad \text{Eq. 4}$$

$$= \ln \frac{\sum_{x \in \chi_0^i} \exp\left(-\frac{1}{2\sigma^2} \|y - hx\|^2\right)}{\sum_{x \in \chi_1^i} \exp\left(-\frac{1}{2\sigma^2} \|y - hx\|^2\right)}$$

for i=1, ..., m, where $M=2^m$. The BICM capacity with perfect CSI and uniform inputs is given by Eq. 5 as shown below:

$$C = m - \sum_{i=1}^{m} E_{b,y,h} \left[ \log_2 \frac{\sum_{x \in \chi} p(y \mid x, h)}{\sum_{x \in \chi_b^i} p(y \mid x, h)} \right] \quad \text{Eq. 5}$$

BICM capacity is the sum of mutual information of m parallel channels as shown in Eq. 6 below:

$$C = \sum_{i=1}^{m} I(L_i, b_i) \quad \text{Eq. 6}$$

This mutual information $I(L_i, b_i)$ can be computed by using a Monte Carlo simulation as shown in Eq. 7 and Eq. 8 below:

$$I(L_i, b_i) = 1 - E[\log_2(1 + \exp(-(1-2b_i)L_i))] \quad \text{Eq. 7}$$

$$I(L_i, b_i) = 1 - \frac{1}{N} \sum_{n=1}^{N} \log_2(1 + \exp(-(1-2b_{i,n})L_{i,n})) \quad \text{Eq. 8}$$

where N is the number of coded modulation symbols, $b_i$ and $L_i$ are the bit and log-likelihood random variables respectively for the level i of coded modulation, and $b_{i,n}$ and $L_{i,n}$ are respectively the bit and log-likelihood values at level i for the n-th symbol.

The BICM approach has proven to be powerful and capacity-approaching for fading channels with applications of low-density parity-check (LDPC) codes. However, many of the previous works design a particular code with a specific modulation scheme. It is desirable to find a general scheme that can support multiple rates and multiple modulation schemes within the context of BICM.

SUMMARY

Described herein are embodiments that provide for digital communication coding methods for designing protograph-based BICM that is general and applies to any modulation. The iterative decoding thresholds of the protograph codes while mapped to higher order modulations are calculated. This general coding framework can support not only multiple rates but also adaptive modulation. Certain families of protograph codes are shown to achieve a threshold within a gap of approximately 0.2-0.3 dB of BICM capacity limit across a wide range of rates and modulations.

BRIEF DESCRIPTION OF THE SEVERAL VIEWS OF THE DRAWINGS

FIG. 1 shows an example of a protograph and demonstrates a copy-and-permute operation on the protograph to obtain a larger graph. The protograph also can be represented by a protomatrix whose elements present the number of edges connecting a variable node (column) to a check node (row) in the protograph.

FIG. 7 shows the protomatrices of rate-compatible family built from extending the rate-¾ protograph whose protomatrix is shown in FIG. 6.

FIG. 10 shows the iterative decoding thresholds from methods described herein with iterative coding thresholds obtained from other mapping methods with rate-½ AR4JA protograph and 16QAM in AWGN channel.

FIG. 11 shows the iterative coding thresholds of AR4JA codes shown in FIG. 3 utilizing the described BICM methods in Rayleigh faded channels.

FIG. 12 shows the iterative coding thresholds of another family of codes whose protomatrices are shown in FIG. 5 and FIG. 6 utilizing the described BICM methods in Rayleigh faded channels.

FIG. 13 shows the iterative coding thresholds of rate-compatible family of codes whose protomatrices are shown in FIG. 7 utilizing the described BICM methods in Rayleigh faded channels.

DETAILED DESCRIPTION

The exemplary embodiments described below show the application of three families of protograph codes with embodiments of the present invention. Note, however, that the present invention is not limited to the protograph codes presented below. Descriptions of these protograph codes are presented to aid in understanding of the invention. Those skilled in the art will understand that other protograph codes are within the scope of the invention. The families of protograph codes presented below include: AR4JA codes, discussed in more detailed in D. Divsalar, et al., and two other families of protograph codes presented in T. V. Nguyen, A. Nosratinia, and D. Divsalar, "The design of rate compatible protograph LDPC codes," IEEE Trans. Commun., 2011, hereinafter T. V. Nguyen, et al. The AR4JA codes have been recommended for the space communication for the code rate-½ or higher. Based on the same AR4JA protograph structure, T. V. Nguyen, et al. provide a design procedure that gave a family of new codes with an improvement of about 0.25 dB in terms of iterative decoding thresholds in AWGN channels compared with that of AR4JA protograph codes. The third family that consists of rate-compatible codes is built from extending a rate-¾ code in the second family. This third family of codes gives rise to coded modulations that can support hybrid ARQ applications, among others.

Figure 2:
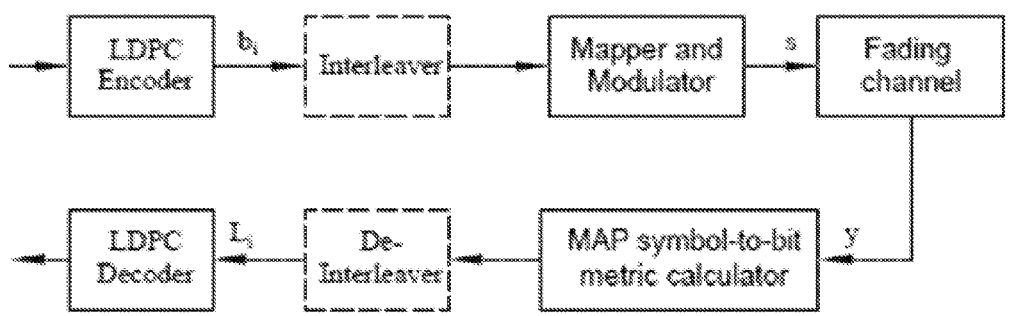
FIG. 2 shows a block diagram of a bit-interleaved coded modulation system.
Figure 3:
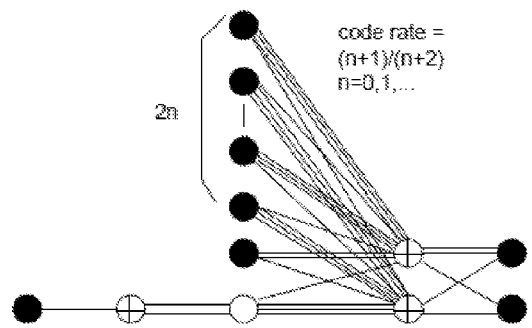
FIG. 3 shows the AR4JA family of protographs with rates ½ and higher.

The family of AR4JA protograph codes is plotted in FIG. 3. In FIG. 3, the dark circles represent transmitted variable nodes, the white circle is a punctured node and the circles with a plus sign are parity check nodes. The graph contains 4+2n transmitted variable nodes and 3 check nodes that is equivalent to code rate $$R = \frac{n+1}{n+2},$$

with n=0, 1, . . . .

Figures 4, 5, 6:
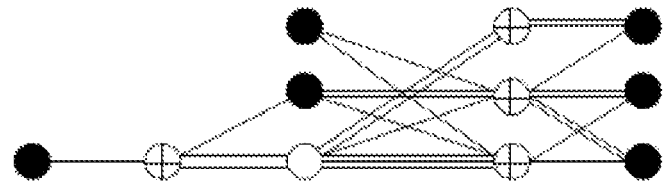
FIG. 4 shows a rate ½ protograph which proves a better iterative decoding threshold.
FIG. 5 shows the protomatrix corresponding to the protograph shown in FIG. 4.
FIG. 6 shows the protomatrices of high-rate (>½) protographs that are extended from the rate-½ protomatrix shown in FIG. 5.

A protograph can also be represented by a protomatrix. For example, the rate-½ AR4JA protograph (n=0) has a protomatrix in the form shown in Eq. 9 below:

$$H_{1/2} = \begin{pmatrix} 1 & 2 & 0 & 0 & 0 \\ 0 & 3 & 1 & 1 & 1 \\ 0 & 1 & 2 & 2 & 1 \end{pmatrix} \quad \text{Eq. 9}$$

where the rows and columns represent the check nodes and variable nodes in the graph respectively. The elements in the matrix are the number of parallel edges that connect the variable node and the check node associated with their positions. The family of AR4JA codes with rate $$R = \frac{n+1}{n+2}$$

has a protomatrix in the form shown in Eq. 10 below:

$$H_{\frac{n+1}{n+2}} = \left( H_{\frac{n}{n+1}} \left| \begin{matrix} 0 & 0 \\ 3 & 1 \\ 1 & 3 \end{matrix} \right. \right) \quad \text{Eq. 10}$$

where n=1, 2, .... The embedded codes with the rate of $$R = \frac{n+1}{n+2}$$

are built by extending the rate −½ code with the protomatrix of Eq. 1.The structure of the rate-½ AR4JA code has 5 variable nodes (one punctured node) and 3 check nodes. For the same rate-½ structure with a slightly larger graph which contains 7 variable nodes (one punctured node) and 4 check nodes, the protograph of a better code in terms of iterative decoding threshold is shown in FIG. 4. Its corresponding protomatrix is shown in FIG. 5. The threshold of this code is 0.395 dB as shown in T. V. Nguyen, et al, which shows a gap of 0.208 dB of capacity, less than that of the rate ½ AR4JA code of Eq. 9 as reported in D. Divsalar, et al. Other high rate protographs which are also built by extending this rate-½ protograph have protomatrices shown in FIG. 6.

Figure 7:
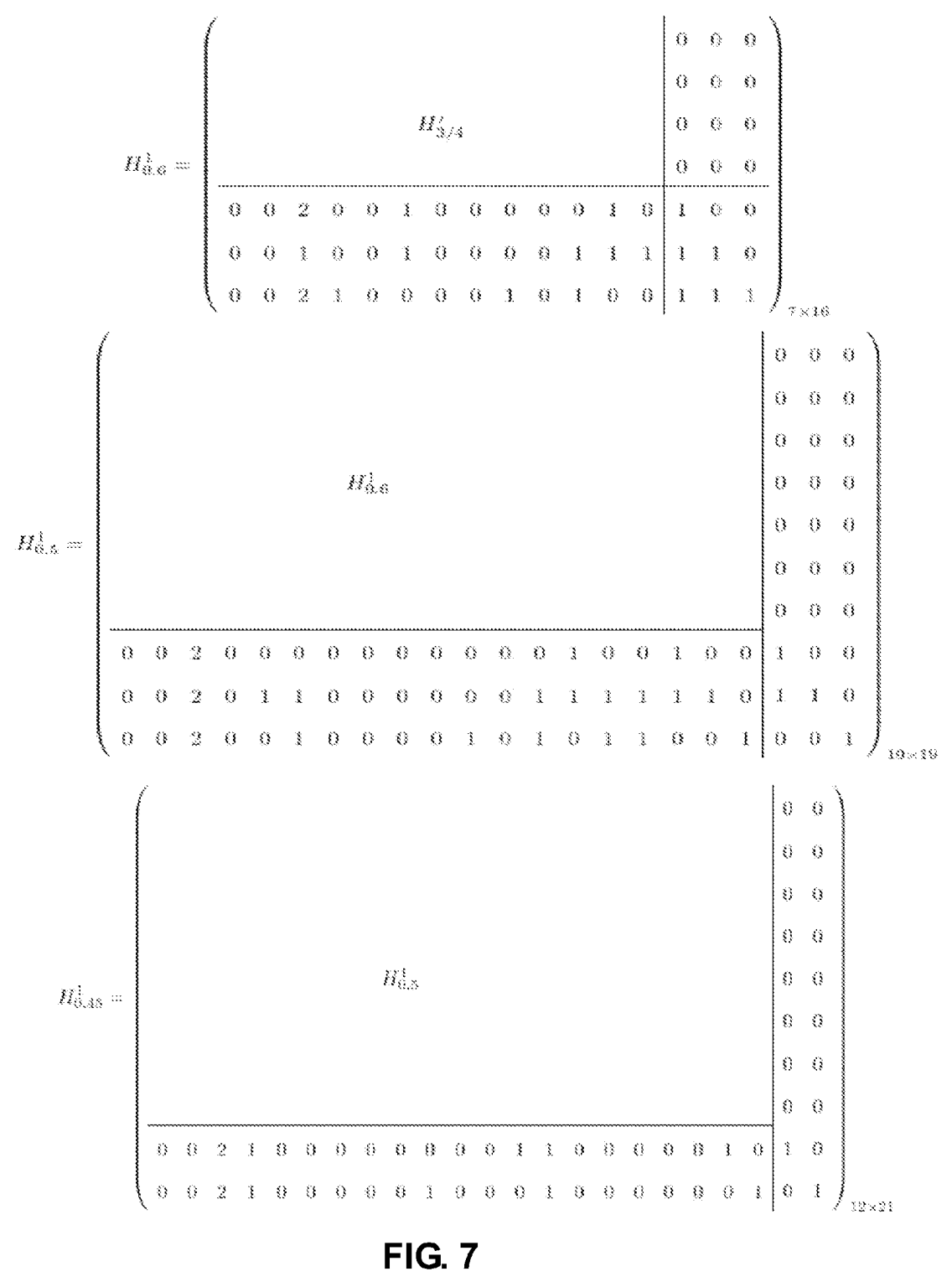

The third family of rate-compatible protograph codes has proto-matrices that are shown in FIG. 7. This family is built from adding equal number of variable (column) and check (row) nodes to the rate-¾ protograph whose protomatrix is shown in FIG. 6. The protograph codes in this family have the same information block-lengths, thus are suitable for Hybrid ARQ applications.

An iterative decoding threshold of a protograph is the minimum channel quality that supports reliable iterative decoding of asymptotically large LDPC codes built from the protograph. T. J. Richardson, M. A. Shokrollahi, and R. L. Urbanke, "Design of capacity-approaching irregular low-density parity-check codes," IEEE Trans. Inform. Theory, vol. 47, no. 2, pp. 619-637, February 2001, describe computation of thresholds of LDPC code ensembles by using density evolution. S. ten Brink, "Convergence behavior of iteratively decoded parallel concatenated codes," IEEE Trans. Commun., vol. 49, no. 10, pp. 1727-1737, October 2001, describe computation of thresholds of LDPC code ensembles by extrinsic information transfer (EXIT) chart techniques. However, the general EXIT chart cannot be applied to compute the thresholds of protograph codes due to its inability of computing thresholds of graphs that have degree-1 variable, punctured variable nodes or protographs with same degree distributions and different thresholds. See, for example, G. Liva, et al. To solve these problems, G. Liva, et al. proposed the PEXIT method that is simple and allows for the computation of thresholds of protographs even more accurately than the method of reciprocal channel approximation (RCA) described in D. Divsalar, et al., cited above. Thresholds of the AR4JA family of protograph codes plotted in FIG. 3 and the other family of protographs were discussed in T. V. Nguyen, et al., cited above.

As discussed above, protograph codes can be represented by a small graph with only a few variable nodes and check nodes. For the purposes of BICM, the binary variable nodes of the code must be mapped to the bit-levels of the modulation. The iterative decoding threshold of the overall coded modulation scheme naturally depends in part on the protograph code, but also on the mapping between the code and the modulation levels.

Figure 8:
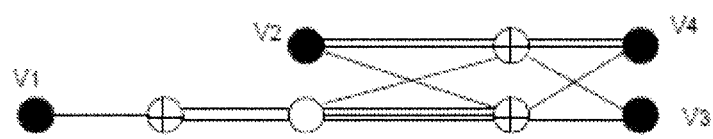
FIG. 8 shows a rate-½ AR4JA protograph.

In D. Divsalar and C. Jones, "Protograph based low error floor LDPC coded modulation," in Proc. IEEE MILCOM, October 2005, pp. 378-385 Vol. 1, hereinafter Divsalar & Jones, Divsalar and Jones proposed a mapping algorithm based on Variable Degree Matched Mapping (VDMM). The idea is to directly assign protograph variable nodes in proportion to mutual information of coded bits in the modulation symbol. This is a well-known water-filling problem. However, in Divsalar & Jones, variable nodes in a protograph are directly assigned to the bits of a modulation symbol. This limits the coded modulation that can be designed with this and similar method to only one particular coded modulation for each protograph. For example, FIG. 8 shows the rate-½ AR4JA protograph with transmitted variable nodes indexed by $V_i$, i=1, . . . , 4. For a specific 16 QAM modulation, the method of Divsalar & Jones is proposed with the mapping {b0, b1, b2, b3}={V2, V4, V1, V3}.

Figure 9:
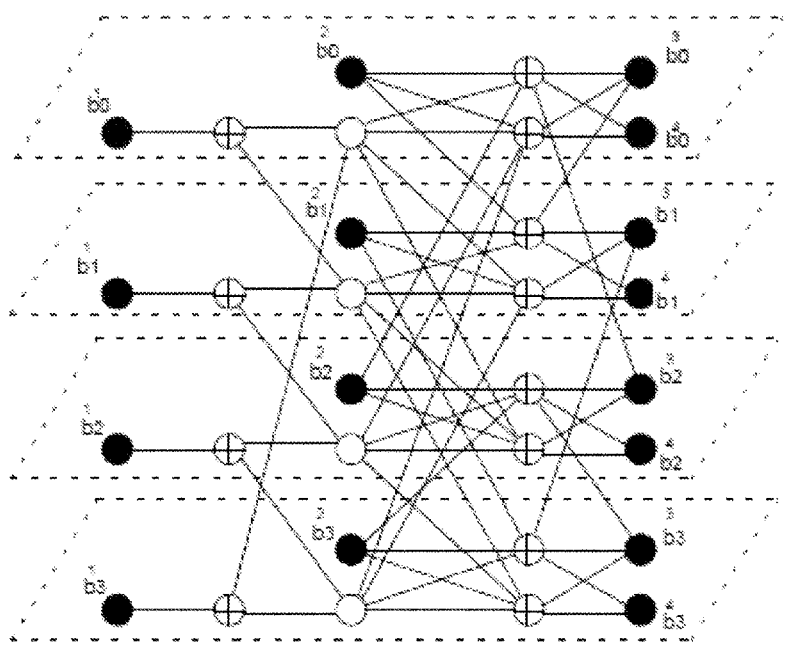
FIG. 9 shows a rate-½ AR4JA protograph after lifting by a factor of 4 with a mapping for 16 QAM.

An exemplary embodiment of the present invention provides a general method that can work for any protograph structure and modulation level and can achieve BICM-liked performance. More specifically, this exemplary embodiment provides a method to map any protograph to any modulation level, unlike the previous art. Exemplary embodiments use a two-stage lifting approach. Assuming that the desired modulation is M-ary and the original protograph has n transmitted variable nodes, the first step is to start with a smaller lifting of the original protograph by a factor of $m=\log_2 M$ to a slightly larger protograph. This protograph transformation may be accomplished using the PEG algorithm disclosed in X. Hu, et al., or other such techniques. An example is shown in FIG. 9, where an intermediate protograph is constructed from m=4 original AR4JA protographs. This intermediate protograph is then mapped to n=4 modulation symbols as follows: each labeling bit position from all the n modulation symbols is mapped to the variable nodes of one of the planes in the intermediate protograph. For example, four $b_0$ bits from four modulation symbols are mapped to the top plane, four $b_1$ bits are mapped to the next plane, etc.

Now, the mapping between coding and modulation is complete within a relatively small "intermediate" protograph. The advantage of this intermediate protograph is that it is small enough to allow optimizations, but it also has enough degrees of freedom to provide a good mapping. Now this intermediate protograph is lifted (via a circulant matrix) to the expected codeword length to form a protograph-based LDPC code.

Embodiments of the present invention may be contrasted with VDMM in terms of flexibility. In VDMM as it is proposed, the coded bits in each protograph correspond to the symbol bits in one transmitted symbol. Thus, for example, a 4-variable node protograph naturally corresponds to 16-QAM. With the proposed framework, however, it is very easy to use any protograph together with any modulation. All that is needed is to produce the right intermediate protograph.

FIG. 10 compares the iterative decoding thresholds of embodiments according to the present invention compared with Divsalar & Jones. By necessity this table is small, as Divsalar & Jones as mentioned above, naturally correspond to only one type of modulation. The iterative decoding threshold of embodiments according to the present invention is slightly better than that of Divsalar & Jones. Note, however, that embodiments according to the present invention are not simply directed at producing the absolutely smallest threshold for the specific case of 16QAM. Embodiments according to the present invention expand the horizon of available designs, as previous designs only allowed the use of modulations whose bit-levels were the same as the number of nodes in a protograph, for example, a protograph with four transmitted nodes could previously be mapped only to a 16-QAM or 16-PSK modulation. As discussed below, the threshold gap to capacity provided by embodiments according to the present invention is very good over a large spectrum of rates and modulations.

Presented below are the results obtained by using the PEXIT algorithm briefly discussed above to compute iterative decoding thresholds. Computation of iterative decoding thresholds for protograph coded modulation using the PEXIT algorithm is similar to that discussed in G. Liva, et al., for AWGN channel, except the initialization step. Instead of using the exact equation, as in the initialization step discussed in G. Liva, et al., the mutual information for coded bits is computed using the Monte Carlo method shown in Eqs. 7 and 8 above.

Figure 14:
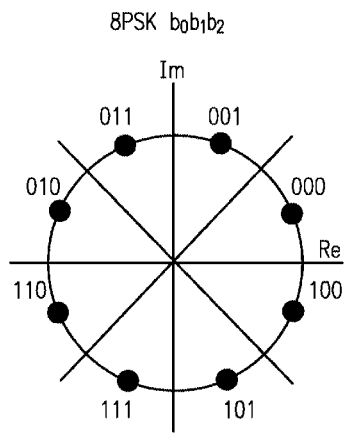
FIG. 14 shows 8PSK with Gray labeling.
Figure 15:
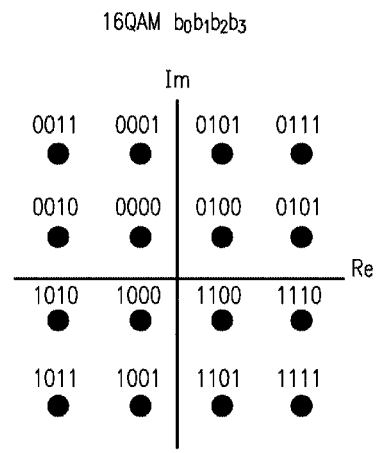
FIG. 15 shows 16QAM with Gray labeling.

The iterative decoding thresholds of protograph-based LDPC coded BICM embodiments according to the present invention are shown tables presented in FIG. 11, FIG. 12 and FIG. 13. From FIG. 11, AR4JA protograph-based coded BICM can operate within about 0.7 dB to the BICM capacity limits. On the other hand, from FIG. 12, the family of protograph codes reported in T. V. Nguyen, et al. can operate within about 0.2-0.3 dB to the BICM capacity limit, which shows an improvement of about 0.4 dB compared with that of the AR4JA family. From FIG. 13, the family of rate-compatible protographs reported in T. V. Nguyen, et al., can operate within about 0.1-0.2 dB to the BICM capacity limit. These observations match with the results reported in T. V. Nguyen, et al. which provided the coding thresholds in AWGN channel. Discussed below is the generation of protograph codes for three modulation schemes with Gray labeling, i.e. Quadrature Phase Shift Keying (QPSK), 8-ary Phase Shift Keying (8PSK) and 16-ary Quadrature Amplitude Modulation (16QAM) and the calculated the iterative decoding thresholds for those protographs. FIG. 14 shows 8PSK with Gray labeling and FIG. 15 shows 16QAM with Gray labeling.

The protograph codes are built from protographs discussed above in two lifting steps. First, the protograph is lifted by a small factor in order to accommodate all modulation schemes of the group of modulation schemes for which protograph codes are to be generated, e.g., a group consisting of QPSK, 8PSK, and 16QAM. In the case of three above modulation schemes, the protograph is lifted by a factor of 12 which is a common divisor of 2, 3 and 4 bits. This first lifting procedure may be implemented by using the progressive edge growth (PEG) algorithm (such as discussed in X. Hu, et al.) in order to remove all multiple parallel edges. Other protograph lifting procedures known in the art may also be used. Secondly, the intermediate protograph is further circulantly lifted to an expected codeword length depending on different applications.

In order to support multiple rates, one can begin with the highest-rate (⅘) protograph. Since the protographs discussed above and shown in FIG. 3, FIG. 4, FIG. 5 and FIG. 6 are embedded, the parity-check matrix of lower rate can be obtained by removing certain columns from codes of higher rate. To decode the lower-rate codewords, the missing coded bits are replaced by erasure at the decoder. Thus the family of protograph codes can be implemented within a common encoder/decoder structure and at the same time being able to support adaptive modulation schemes as well. In order to support rate-compatible codes whose protomatrices are shown in FIG. 7, one can begin with the lowest rate (0.45) protograph. Other higher-rate codes are decoded by replacing missing parity bits by erasures at the decoder, therefore the same decoder can be used for the rate-compatible codes.

Figure 16:
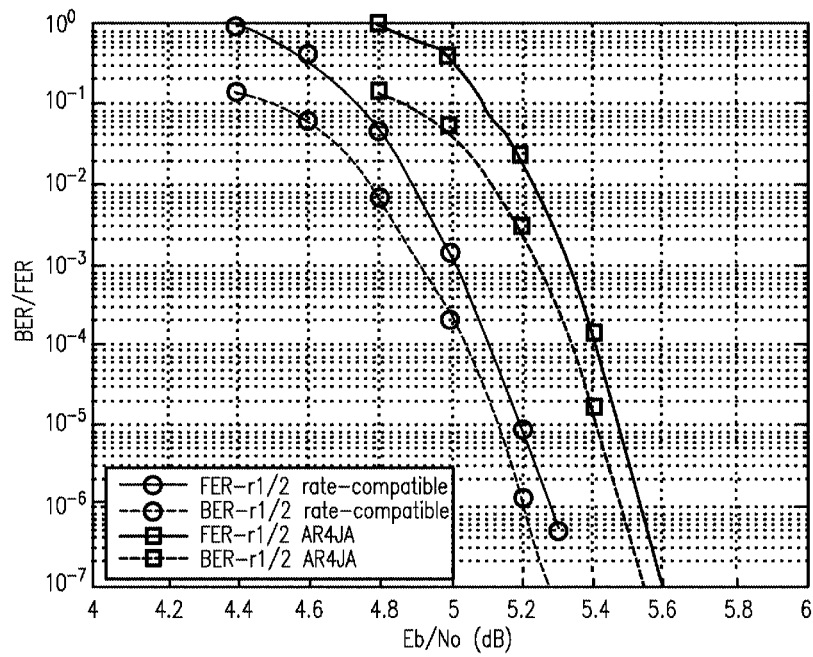
FIG. 16 shows the performance of rate-½ AR4JA protograph and the rate-½ protograph whose protomatrix is shown in FIG. 7 with 16QAM in Rayleigh channel and 16 k information bits.

The performance of the rate-½ protograph code reported in T. V. Nguyen, et al., whose protomatrix is shown in FIG. 7 as well as that of rate-½ AR4JA code transmitted with 16QAM in Rayleigh channel is plotted in FIG. 16 with the information block-length of 16 k. Both these coded modulations perform within 1 to 1.2 dB of their capacity limit at $10^{-6}$ FER.

The foregoing Detailed Description of exemplary and preferred embodiments is presented for purposes of illustration and disclosure in accordance with the requirements of the law. It is not intended to be exhaustive nor to limit the invention to the precise form or forms described, but only to enable others skilled in the art to understand how the invention may be suited for a particular use or implementation. The possibility of modifications and variations will be apparent to practitioners skilled in the art.

No limitation is intended by the description of exemplary embodiments which may have included tolerances, feature dimensions, specific operating conditions, engineering specifications, or the like, and which may vary between implementations or with changes to the state of the art, and no limitation should be implied therefrom. In particular it is to be understood that the disclosures are not limited to particular compositions or biological systems, which can, of course, vary. This disclosure has been made with respect to the current state of the art, but also contemplates advancements and that adaptations in the future may take into consideration of those advancements, namely in accordance with the then current state of the art. It is intended that the scope of the invention be defined by the Claims as written and equivalents as applicable. It is also to be understood that the terminology used herein is for the purpose of describing particular embodiments only, and is not intended to be limiting. Reference to a claim element in the singular is not intended to mean "one and only one" unless explicitly so stated. As used in this specification and the appended claims, the singular forms "a," "an," and "the" include plural referents unless the content clearly dictates otherwise. The term "several" includes two or more referents unless the content clearly dictates otherwise. Unless defined otherwise, all technical and scientific terms used herein have the same meaning as commonly understood by one of ordinary skill in the art to which the disclosure pertains.

Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising step(s) for . . . "

A number of embodiments of the disclosure have been described. Nevertheless, it will be understood that various modifications may be made without departing from the spirit and scope of the present disclosure. Accordingly, other embodiments are within the scope of the following claims.

What is claimed is:

1. A digital communication coding method comprising:
 selecting a first protograph having a first protograph structure;
 lifting the first protograph to a second protograph by a selected factor; and
 lifting the second protograph to a third protograph via a circulant matrix, wherein the third protograph provides a protograph code having a desired codeword length, and wherein the selected factor is m, and m is calculated by the equation as follows:

$m = \log_2 M$ where M is equal to the number of modulation symbols in a signal.

2. The digital communication coding method according to claim 1, wherein the signal is modulated as quadrate phase-shifted, 8-ary phase shift keying, or 16-ary quadrature amplitude modulated.

3. The digital communication coding method according to claim 1, wherein the first protograph has n variable nodes and the second protograph has multiple planes and each labeling bit position from each modulation symbol is mapped to a variable node of one of the planes of the second protograph.

4. A digital communication coding method comprising:
selecting a first protograph having a first protograph structure;
lifting the first protograph to a second protograph by a selected factor; and
lifting the second protograph to a third protograph via a circulant matrix, wherein the third protograph provides a protograph code having a desired codeword length, and wherein the coding method supports signals having multiple numbers of modulation symbols in a signal, wherein the multiple numbers are represented by $M_1, M_2, \ldots, M_n$ and the selected factor comprises a common divisor from the solution of the equations shown below for $m_1, m_2 \ldots m_n$:

$$m_1 = \log_2 M_1, m_2 = \log_2 M_2, \ldots, m_n = \log_2 M_n.$$

5. The digital communication coding method according to claim 1, wherein the first protograph is lifted to second protograph by a progressive edge-growth algorithm.

6. The digital communication coding method according to claim 1, wherein the first protograph comprises a protograph from AR4JA codes.

7. The digital communication coding method according to claim 1, wherein the first protograph comprises a rate-compatible protograph.

8. The digital communication coding method according to claim 1, wherein the first protograph comprises a protograph-based LDPC convolutional code.

9. The digital communication coding method according to claim 1, wherein the selected factor is selected to accommodate all modulation schemes within a group of modulation schemes.

10. A digital communication system comprising:
a low density parity check encoder;
a bit interleaver;
a mapper and modulator;
wherein the low density parity check encoder codes binary data with a code having a selected codeword length, and the code is generated by:
selecting a first protograph having a first protograph structure;
lifting the first protograph to a second protograph by a selected factor; and
lifting the second protograph to a third protograph via a circulant matrix, wherein the third protograph provides a protograph code having the selected codeword length, and wherein the selected factor is m, and m is calculated by the equation as follows:

$$m = \log_2 M$$

where M is equal to the number of modulation symbols in a signal.

11. The digital communication system according to claim 10, wherein the signal is modulated as quadrate phase-shifted, 8-ary phase shift keying, or 16-ary quadrature amplitude modulated.

12. The digital communication system according to claim 10, wherein the first protograph has n variable nodes and the second protograph has multiple planes and each labeling bit position from each modulation symbol is mapped to a variable node of one of the planes of the second protograph.

13. A digital communication system comprising:
a low density parity check encoder;
a bit interleaver;
a mapper and modulator;
wherein the low density parity check encoder codes binary data with a code having a selected codeword length, and the code is generated by:
selecting a first protograph having a first protograph structure;
lifting the first protograph to a second protograph by a selected factor; and
lifting the second protograph to a third protograph via a circulant matrix, wherein the third protograph provides a protograph code having the selected codeword length, and wherein the digital communication system supports signals having multiple numbers of modulation symbols in a signal, wherein the multiple numbers are represented by $M_1, M_2, \ldots M_n$ and the selected factor comprises a common divisor from the solution of the equations shown below for $m_1, m_2 \ldots m_n$:

$$m_1 = \log_2 M_1, m_2 = \log_2 M_2, \ldots, m_n = \log_2 M_n.$$

14. The digital communication system according to claim 10, wherein the first protograph is lifted to second protograph by a progressive edge-growth algorithm.

15. The digital communication system according to claim 10, wherein the first protograph comprises a protograph from AR4JA codes.

16. The digital communication system according to claim 10, wherein the first protograph comprises a rate-compatible protograph.

17. The digital communication system according to claim 10, wherein the first protograph comprises a protograph-based LDPC convolutional code.

18. The digital communication system according to claim 10, wherein the selected factor is selected to accommodate all modulation schemes within a group of modulation schemes.

* * * * *